United States Patent
Xiong et al.

(10) Patent No.: US 8,031,005 B2
(45) Date of Patent: Oct. 4, 2011

(54) AMPLIFIER SUPPORTING MULTIPLE GAIN MODES

(75) Inventors: Zhijie Xiong, Austin, TX (US); Harish S. Muthali, Round Rock, TX (US)

(73) Assignee: QUALCOMM, Incorporated, San Diego, CA (US)

( * ) Notice: Subject to any disclaimer, the term of this patent is extended or adjusted under 35 U.S.C. 154(b) by 139 days.

(21) Appl. No.: 12/512,950

(22) Filed: Jul. 30, 2009

(65) Prior Publication Data

US 2010/0237947 A1    Sep. 23, 2010

Related U.S. Application Data

(60) Provisional application No. 61/162,511, filed on Mar. 23, 2009.

(51) Int. Cl.
*H03F 1/22* (2006.01)
*H03G 3/30* (2006.01)

(52) U.S. Cl. .................... 330/311; 330/283
(58) Field of Classification Search .......... 330/283, 330/311
See application file for complete search history.

(56) References Cited

U.S. PATENT DOCUMENTS

| | | | |
|---|---|---|---|
| 7,474,158 B1 * | 1/2009 | Yim et al. | 330/311 |
| 7,679,452 B2 * | 3/2010 | Afonso Perez | 330/311 |
| 2005/0068106 A1 | 3/2005 | Irvine | |
| 2007/0229154 A1 | 10/2007 | Kim et al. | |

FOREIGN PATENT DOCUMENTS

EP    1748553    1/2007

OTHER PUBLICATIONS

Che-Sheng Chen et al: "A 2.5GHz 90nm CMOS Triple Gain Mode LNA for WiMAX Applications" Signals, Systems and Electronics, 2007. ISSSE '07. International Symposium on, IEEE, PI, Jul. 1, 2007, pp. 367-369, XP031129290 ISBN: 978-1-4244-1448-2 pa.
International Search Report and Written Opinion—PCT/US2010/028353, International Search Authority—European Patent Office—Jul. 6, 2010.

* cited by examiner

*Primary Examiner* — Steven Mottola
(74) *Attorney, Agent, or Firm* — Ramin Mobarhan

(57) ABSTRACT

Techniques for designing a low-noise amplifier (LNA) for operation over a wide range of input power levels. In an exemplary embodiment, a first gain path is provided in parallel with a second gain path. The first gain path includes a differential cascode amplifier with inductor source degeneration. The second gain path includes a differential cascode amplifier without inductor source degeneration. The cascode transistors of the gain paths may be selectively biased to enable or disable the first and/or second gain path. By selectively biasing the cascode transistors and input transistors, various combinations of the first and second gain paths may be selected to provide an optimized gain configuration for any input power level.

15 Claims, 6 Drawing Sheets

AMPLIFIER SUPPORTING MULTIPLE GAIN MODES

CLAIM OF PRIORITY UNDER 35 U.S.C. §119

The present Application for Patent claims priority to U.S. Provisional Application Ser. No. 61/162,511, filed Mar. 23, 2009, entitled "LNA Noise Figure and Linearity Optimization," the disclosure of which is hereby expressly incorporated by reference herein.

BACKGROUND

1. Field

The disclosure relates to integrated circuit (IC) design, and more particularly, to the design of amplifiers, including low-noise amplifiers (LNA's).

2. Background

Receivers for wireless communications often incorporate a low-noise amplifier (LNA) in the radio-frequency (RF) front-end. The LNA may be designed to accommodate a wide range of power levels at the input to the receiver. For example, when the input to the receiver is at a high power level, the LNA must exhibit good linearity characteristics to avoid introducing non-linear distortion products into the LNA output. Conversely, when the input to the receiver is at a low power level, the LNA must exhibit high gain and low noise characteristics to adequately amplify the input signal without generating excessive noise. In amplifier design, the requirements of good linearity and low noise are often conflicting.

It would be desirable to provide techniques for designing an LNA that can accommodate a wide range of expected input power levels.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
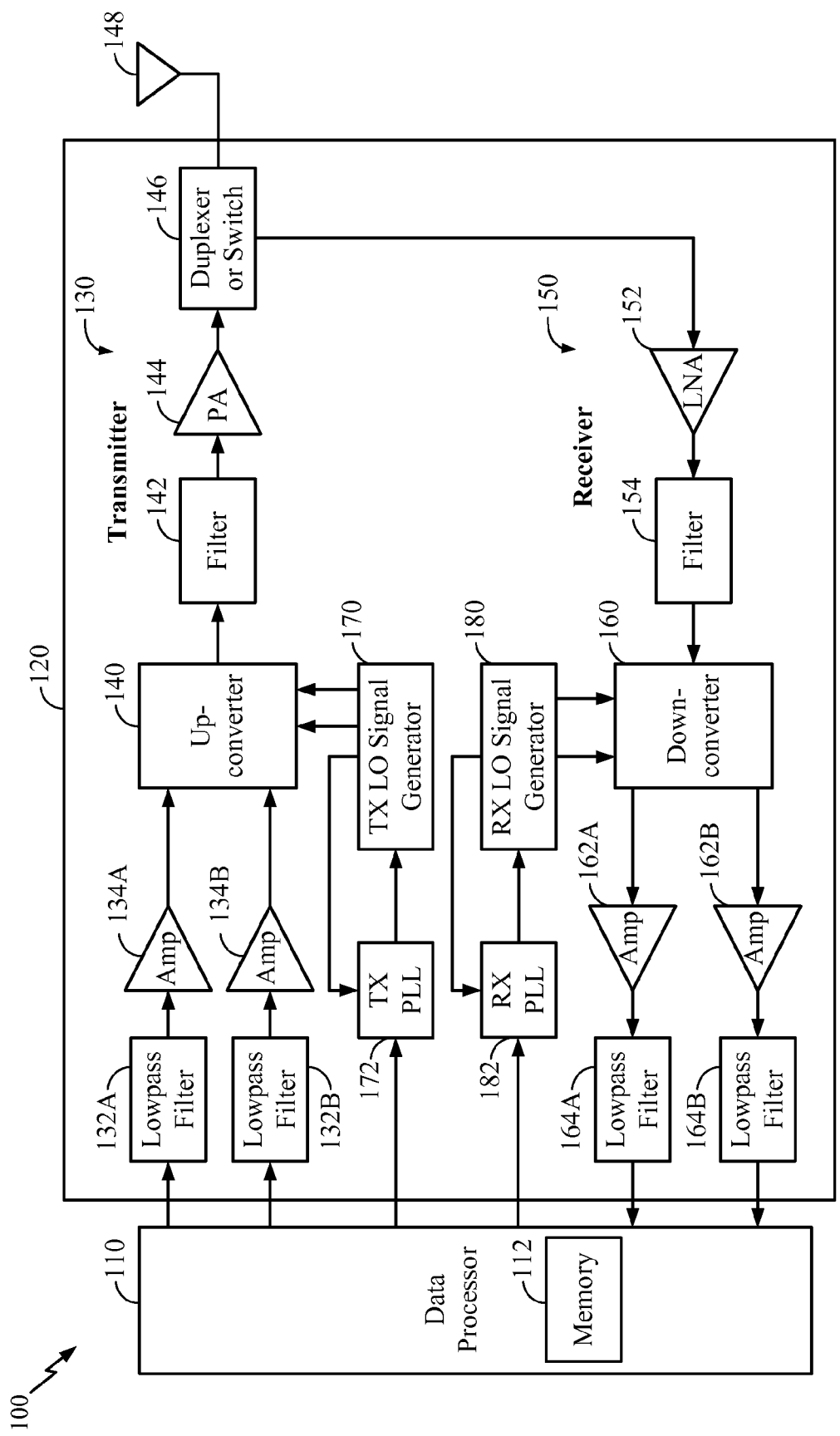
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. Note the device 100 is shown for illustrative purposes only, and is not meant to restrict the scope of the present disclosure in any way.

In the design shown in FIG. 1, wireless device 100 includes a transceiver 120 and a data processor 110 having a memory 112 to store data and program codes. Transceiver 120 includes a transmitter 130 and a receiver 150 that support bi-directional communication. In general, wireless device 100 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. Within transmitter 130, lowpass filters 132a and 132b filter the I and Q analog output signals, respectively, to remove undesired images caused by the prior digital-to-analog conversion. Amplifiers (Amp) 134a and 134b amplify the signals from lowpass filters 132a and 132b, respectively, and provide I and Q baseband signals. An upconverter 140 upconverts the I and Q baseband signals with I and Q transmit (TX) local oscillating (LO) signals from a TX LO signal generator 170 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desirable RF input signal. A downconverter 160 downconverts the RF input signal with I and Q receive (RX) LO signals from an RX LO signal generator 180 and provides I and Q baseband signals. The I and Q baseband signals are amplified by amplifiers 162a and 162b and further filtered by lowpass filters 164a and 164b to obtain I and Q analog input signals, which are provided to data processor 110.

TX LO signal generator 170 generates the I and Q TX LO signals used for frequency upconversion. RX LO signal generator 180 generates the I and Q RX LO signals used for frequency downconversion. Each LO signal is a periodic signal with a particular fundamental frequency. A PLL 172 receives timing information from data processor 110 and generates a control signal used to adjust the frequency and/or phase of the TX LO signals from LO signal generator 170. Similarly, a PLL 182 receives timing information from data processor 110 and generates a control signal used to adjust the frequency and/or phase of the RX LO signals from LO signal generator 180.

FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on one or more analog integrated circuits (ICs), RF ICs (RFICs), mixed-signal ICs, etc.

Figure 2:
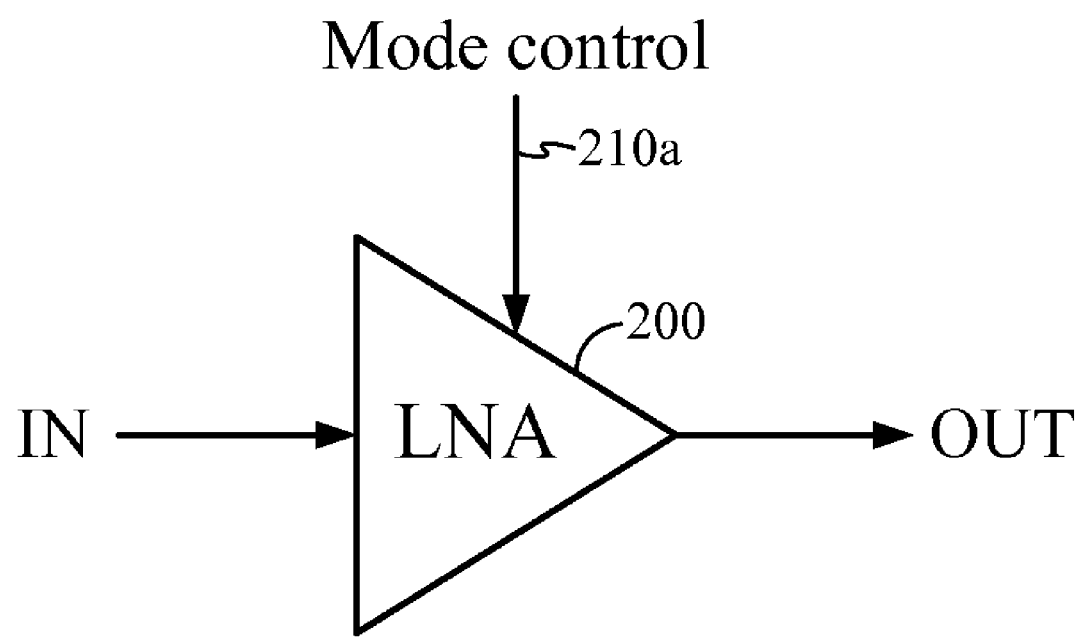
FIG. 2 illustrates an exemplary embodiment of an LNA that may be employed in the wireless communication device of FIG. 1.

FIG. 2 illustrates an exemplary embodiment 200 of an LNA that may be employed in the wireless communication device 100 of FIG. 1. The LNA 200 may be employed as, e.g., the LNA 152 of the device 100 in FIG. 1. Note while exemplary embodiments of the present disclosure are described in the context of an LNA, it will be appreciated that the techniques of the present disclosure may readily be applied to the design of other types of amplifiers. Such alternative exemplary embodiments are contemplated to be within the scope of the present disclosure.

The LNA 200 amplifies an input signal IN to generate an output signal OUT, with the operation mode of the LNA 200 controlled by a mode control signal 210*a*. In an exemplary embodiment, the mode control signal 210*a* may configure the LNA 200 to operate in a low-noise (LN) mode or a high-linearity (HL) mode. In the LN mode, the LNA 200 may be designed to provide relatively high gain to the input signal IN while minimizing the noise figure. In the HL mode, the LNA 200 may be designed for maximum linearity, so as to avoid introducing excessive distortion into the output signal OUT.

In an exemplary embodiment, the mode control signal 210*a* may be set depending on, e.g., the output of a detector (not shown) which detects the presence of jammers in the input signal IN.

Figure 3:
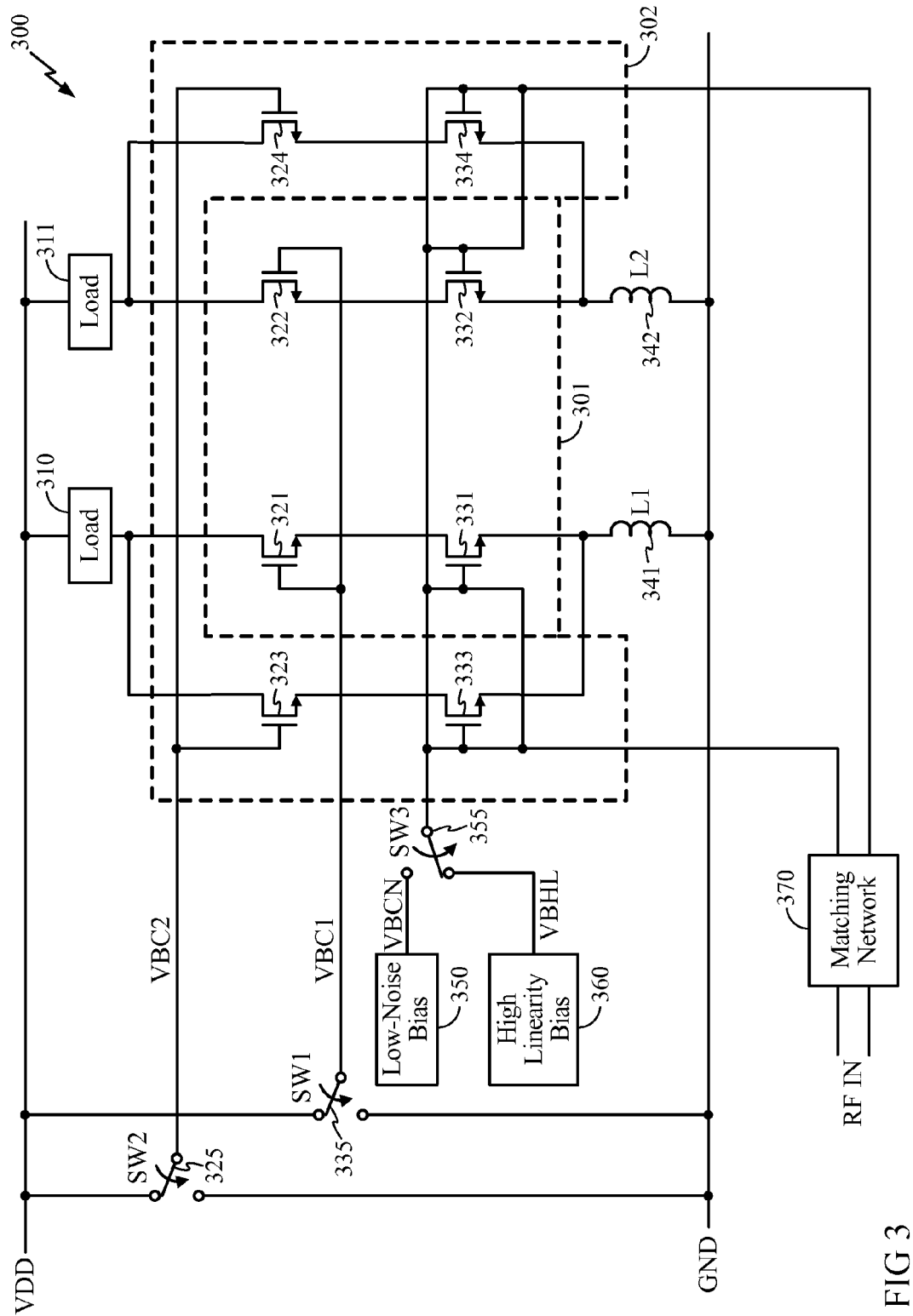
FIG. 3 illustrates an implementation of an LNA that adopts a dual architecture, wherein certain sets of components are replicated to accommodate operation in both an HL mode and an LN mode.

FIG. 3 illustrates an implementation 300 of an LNA that adopts a dual architecture, wherein certain sets of components are replicated to accommodate operation in two gain modes, e.g., an HL mode and an LN mode. Further details of the LNA 300 are disclosed in the co-pending U.S. Provisional Patent Application entitled "Amplifier Supporting Multiple Gain Modes" by Anup Savla and Roger Brockenbrough, assigned to the assignee of the present application, filed concurrently with the present application (DOCKET NO. 092948P1), whose contents are hereby incorporated by reference in their entirety.

In the LNA 300, an RF input signal RF IN is coupled to a matching network 370, which matches the impedance of the RF input signal to the LNA input for optimal power delivery. The differential output of the matching network 370 is coupled to first input transistors 331, 332, and also to second input transistors 333, 334.

The first input transistors 331, 332 are coupled to loads 310, 311 via first cascode transistors 321, 322, respectively. The second input transistors 333, 334 are also coupled to loads 310, 311 via second cascode transistors 323, 324, respectively. Input transistors 331, 333 share a common source inductor 341 having inductance L1, while input transistors 332, 334 share a common source inductor 342 having inductance L2. Note a first gain path 301 is formed by first input transistors 331, 332 and first cascode transistors 321, 322, while a second gain path 302 is formed by second input transistors 333, 334 and second cascode transistors 323, 324.

In the LNA 300, the gate bias voltage applied to input transistors 331-334 is controlled by a switch SW3 355. The switch SW3 355 may be configured by a mode selection control voltage (e.g., signal 210*a* in FIG. 2), which may select between a low-noise bias voltage VBLN generated by a low-noise bias generator 350, and a high-linearity bias voltage VBHL generated by a high-linearity bias generator 360. It will be appreciated that the bias voltage VBLN may bias transistors 331-334 for optimal operation in the LN mode, while the bias voltage VBHL may bias transistors 331-334 for optimal operation in the HL mode. In this manner, trade-offs in performance associated with the oftentimes conflicting requirements of the LN and HL modes may advantageously be avoided.

As further shown in FIG. 3, the first cascode transistors 321, 322 may be selectively enabled or disabled by a switch SW1 335, which pulls the gates of the transistors 321, 322 to either a high or a low voltage. Similarly, the second cascode transistors 323, 324 may be selectively enabled or disabled by a switch SW2 325, which pulls the gates of the transistors 323, 324 to either a high or a low voltage.

In one implementation, when the LNA 300 operates in LN mode, the first and second cascode transistors 321-324 are turned on via the switches SW1 335 and SW2 325, thereby simultaneously enabling the first and second gain paths 301 and 302. Alternatively, when the LNA 300 operates in HL mode, either the first 321, 322 or second 323, 324 cascode transistors are turned on, thereby enabling either the first 301 or the second 302 gain path.

It will be appreciated that by appropriately setting the switches SW1 335 and SW2 325, the total gain provided to the input signal RF IN may advantageously be adjusted by selectively enabling or disabling the first and/or second gain paths, without affecting the impedance of the LNA presented to the matching network 370.

Figure 4:
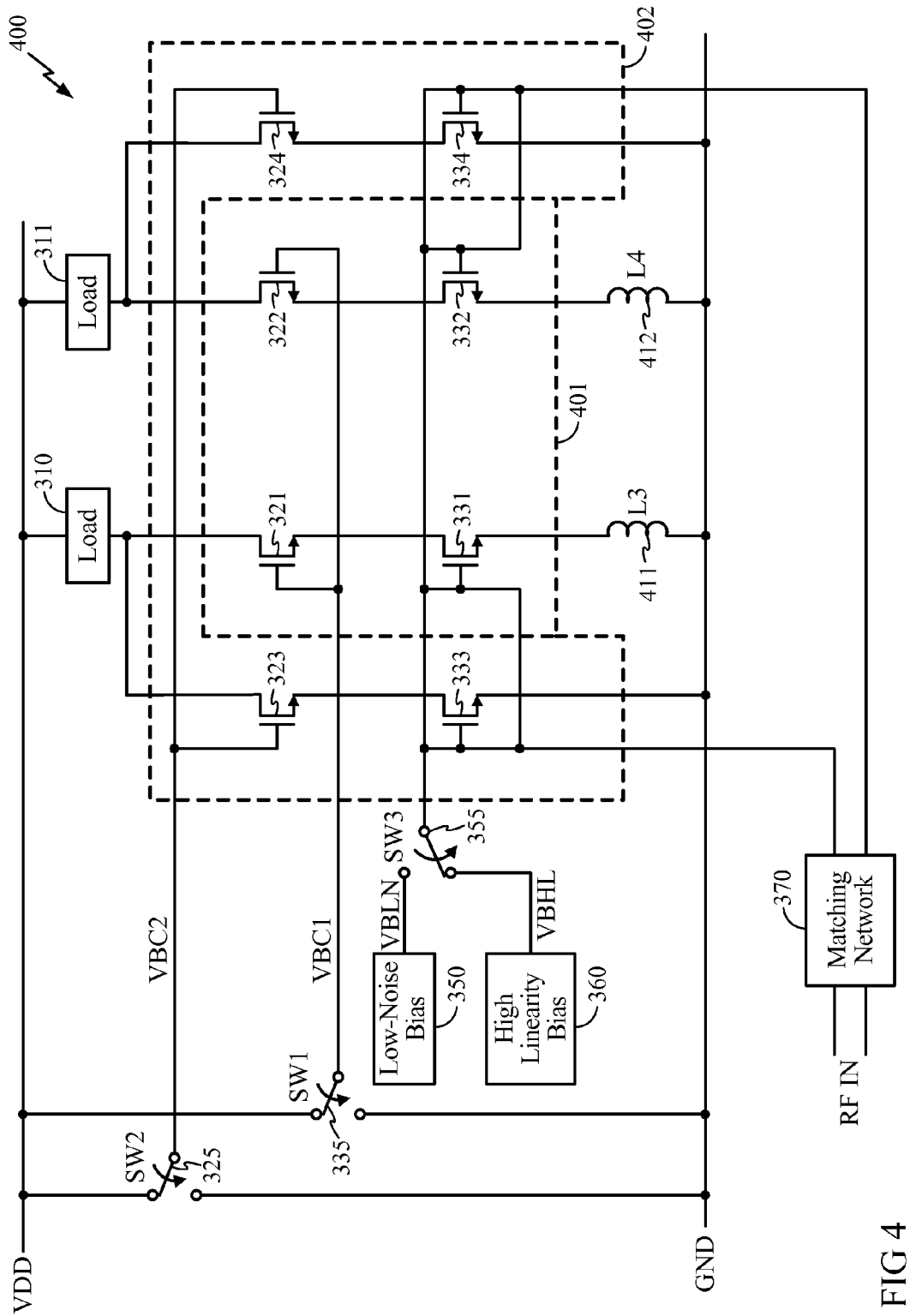
FIG. 4 illustrates an exemplary embodiment of an LNA according to the present disclosure.

FIG. 4 illustrates an exemplary embodiment 400 of an LNA according to the present disclosure. In FIG. 4, first input transistor 331 has an inductor 411 of inductance L3 coupled to its source, while first input transistor 332 has an inductor 412 of inductance L4 coupled to its source. In an exemplary embodiment, L3 may be designed to be equal to L4. As further shown in FIG. 4, second input transistors 333, 334 are both directly coupled to RF ground at their sources. Note a first gain path 401 is formed by first input transistors 331, 332 and first cascode transistors 321, 322, while a second gain path 402 is formed by second input transistors 333, 334 and second cascode transistors 323, 324.

In an exemplary embodiment, when the LNA 400 operates in HL mode, the switch SW3 355 couples the bias voltage VBHL to the gates of first and second input transistors 331-334. First cascode transistors 321, 322 are turned on by switch SW1 335, while second cascode transistors 323, 324 are turned off by switch SW2 325. In this manner, the first gain path 401 is enabled, while the second gain path 402 is disabled. Thus in HL mode, the LNA 400 may benefit from the better linearity of the first gain path 401 provided by the source degeneration inductors 341, 342.

In an exemplary embodiment, when the LNA 400 operates in LN mode, the switch SW3 355 couples the bias voltage VBLN to the gates of first and second input transistors 331-334. Furthermore, in LN mode, first and second cascode transistors 321-324 are turned on by switches SW1 335 and SW2 325. In this manner, the first gain path 401 and the second gain path 402 are simultaneously enabled. It will be appreciated that in LN mode, the LNA 400 may benefit from the combination of the gain provided by the first gain path 401 and the gain provided by the second gain path 402, which may itself offer higher gain than the first gain path 401 due to the absence of inductor source degeneration coupled to the second gain path 402.

In an alternative exemplary embodiment, since transistors 321, 322 are turned on in both LN and HL modes, the switch SW1 335 may be omitted, and the gates of transistors 321, 322 coupled to a fixed high bias voltage. It will nevertheless be appreciated that, in an exemplary embodiment, provision of the switch SW1 335, along with SW2 325, may advantageously allow the entire LNA 400 to be powered on or off when desired.

One of ordinary skill in the art will appreciate that the techniques described hereinabove may readily be applied to designing amplifiers having more than two gain modes. For example, multiple operation modes with incrementally improved gain or linearity characteristics may be designed by providing more than two gain paths (e.g., 401 and 402) in parallel, each gain path having cascode transistors that may be selectively enabled or disabled. Such alternative exemplary embodiments are contemplated to be within the scope of the present disclosure.

Figure 4A:
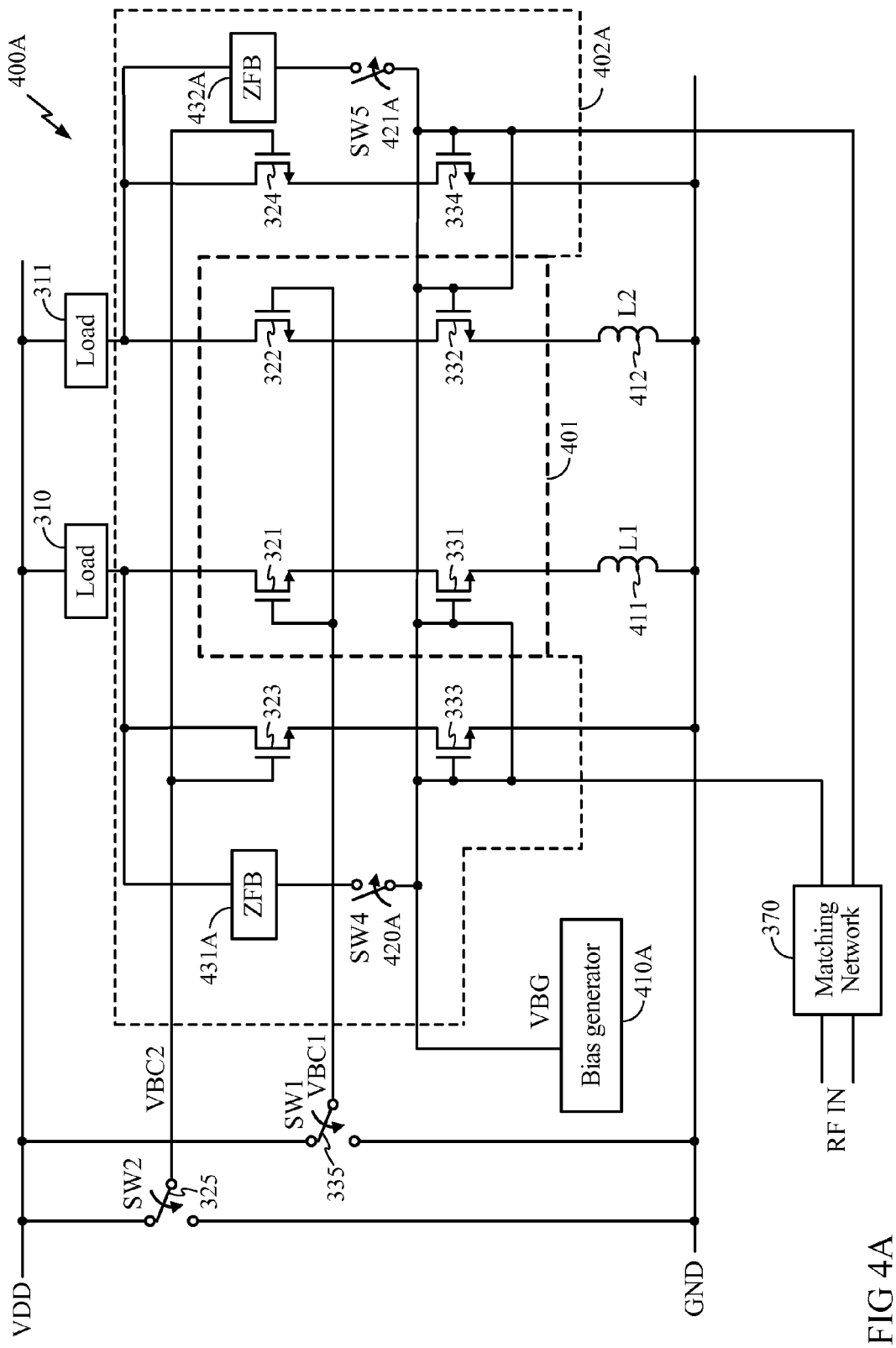
FIG. 4A illustrates an exemplary embodiment of an LNA that accommodates a third mode wherein the second gain path is turned on and the first gain path is turned off.

FIG. 4A illustrates an exemplary embodiment 400A of an LNA that accommodates a third mode wherein a modified second gain path 402A is turned on and the first gain path 401 is turned off. In FIG. 4A, two switches SW4 420A and SW5 421A are closed during the third mode, thereby coupling the inputs of the second gain path 402A to the cascode outputs through feedback impedances ZFB 431A and ZFB 432A. In an exemplary embodiment, the feedback impedances 431A and 431B may be resistors designed to ensure stability of the LNA 400 during the third mode of operation. Further as shown in FIG. 4A, a bias generator 410A is configured to output the appropriate bias voltage VBG for input transistors 331-334 depending on the mode of operation, e.g., LN mode, HL mode, or the third mode.

Figure 5:
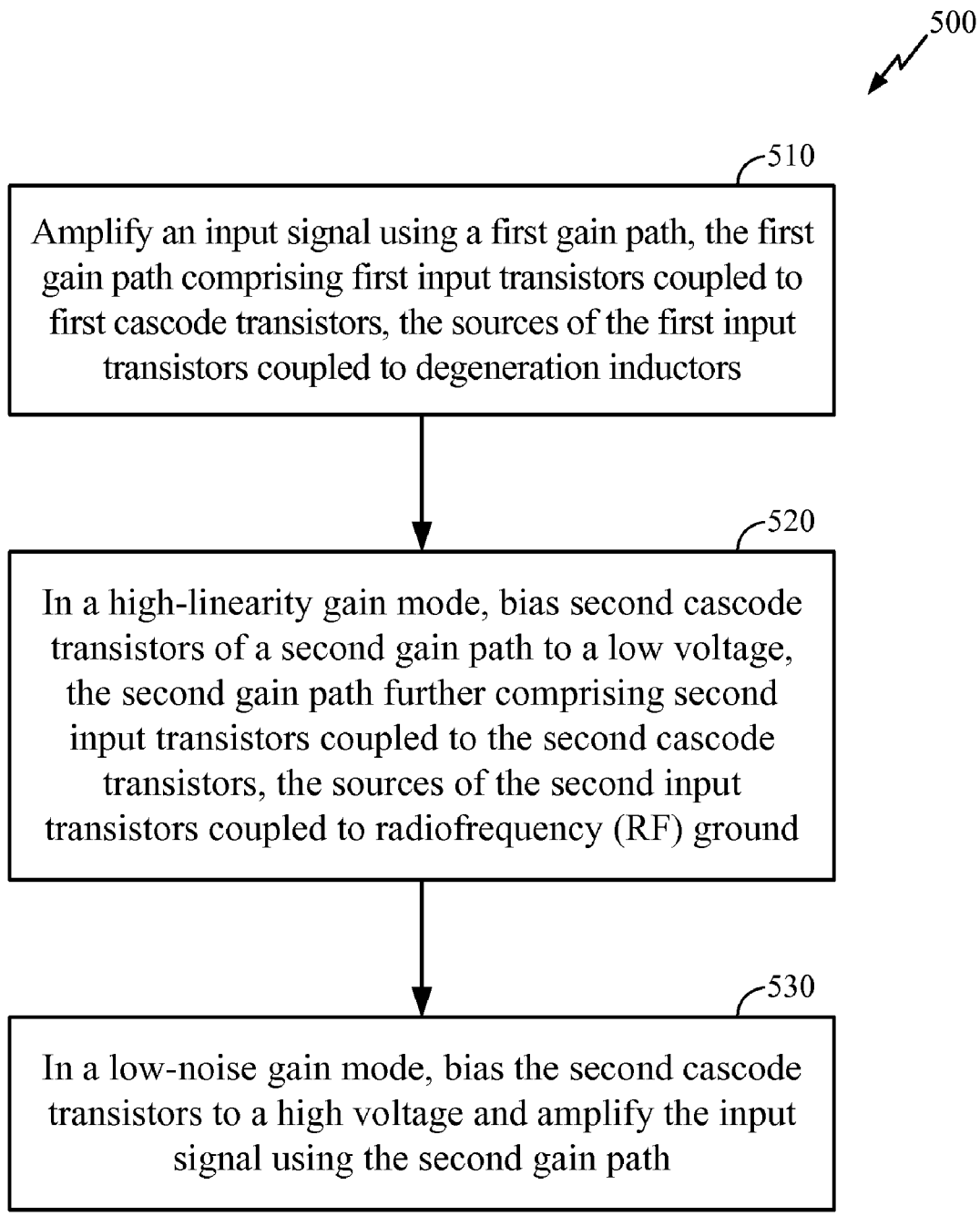
FIG. 5 illustrates an exemplary embodiment of a method according to the present disclosure.

FIG. 5 illustrates an exemplary embodiment 500 of a method according to the present disclosure. Note the method 500 is shown for illustrative purposes only, and is not meant to limit the scope of the present disclosure to any particular method shown.

In FIG. 5, at block 510, an input signal is amplified using a first gain path. The first gain path comprises first input transistors coupled to first cascode transistors, and the sources of the first input transistors are coupled to degeneration inductors.

At block 520, in a high-linearity gain mode, second cascode transistors of a second gain path are biased using a low voltage. The second gain path further comprises second input transistors coupled to the second cascode transistors, and the sources of the second input transistors are coupled to radio-frequency (RF) ground.

At block 530, in a low-noise gain mode, the second cascode transistors are biased using a high voltage, and the input signal is amplified using the second gain path.

One of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for amplifying a signal supporting a plurality of gain modes, comprising:
    a first gain path comprising first input transistors coupled to first cascode transistors, where the sources of the first input transistors are coupled to degeneration inductors; and
    a second gain path comprising second input transistors coupled to second cascode transistors, where the sources of the second input transistors are coupled to radio-frequency (RF) ground, the gates of the second cascode transistors are coupled to a low bias voltage in a high-linearity gain mode and to a high bias voltage in a low-noise gain mode, the outputs of the first cascode transistors are coupled to the outputs of the second cascode transistors, and the gates of the first input transistors are coupled to a low-noise voltage bias in the low-noise gain mode, and to a high-linearity voltage bias in the high-linearity gain mode.

2. The apparatus of claim 1, wherein the gates of the second input transistors are coupled to the low-noise voltage bias in the low-noise gain mode, and to the high-linearity voltage bias in the high-linearity gain mode.

3. The apparatus of claim 1, wherein the gates of the second input transistors are coupled to a second low-noise voltage bias in the low-noise gain mode, the second low-noise voltage bias being distinct from the low-noise voltage bias, and to a second high-linearity voltage bias in the high-linearity gain mode, the second high-linearity voltage bias being distinct from the high-linearity voltage bias.

4. An apparatus for amplifying a signal supporting a plurality of gain modes, comprising:
    a first gain path comprising first input transistors coupled to first cascode transistors, where the sources of the first input transistors are coupled to degeneration inductors;
    a second gain path comprising second input transistors coupled to second cascode transistors, where the sources of the second input transistors are coupled to radio-frequency (RF) ground, the gates of the second cascode transistors are selectively coupled to a low bias voltage in a high-linearity gain mode and to a high bias voltage in a low-noise gain mode, the outputs of the first cascode transistors are coupled to the outputs of the second cascode transistors, and the gates of the first cascode transistors are coupled to a low bias voltage in a power-down mode.

5. The apparatus of claim 4, wherein the gates of the first cascode transistors are coupled to a high bias voltage in both the low-noise gain mode and the high-linearity gain mode.

6. An apparatus for amplifying a signal supporting a plurality of gain modes, comprising:
    a first gain path comprising first input transistors coupled to first cascode transistors, where the sources of the first input transistors are coupled to degeneration inductors; and
    a second gain path comprising second input transistors coupled to second cascode transistors, where the sources of the second input transistors are coupled to radio-frequency (RF) ground, the gates of the second cascode transistors are coupled to a low bias voltage in a high-linearity gain mode and to a high bias voltage in a low-noise gain mode, the outputs of the first cascode transistors are coupled to the outputs of the second cascode transistors, and
    a third gain path comprising third input transistors coupled to third cascode transistors, where the sources of the third input transistors are coupled to second degeneration inductors having lower inductance than the degeneration inductors coupled to the first input transistors, where the gates of the third cascode transistors are coupled to a low bias voltage in the low-noise gain mode and to a high bias voltage in an intermediate gain mode, and the outputs of the third cascode transistors are coupled to the outputs of the first and second cascode transistors.

7. A method for amplifying a signal supporting a plurality of gain modes, comprising:
    amplifying an input signal using a first gain path, the first gain path comprising first input transistors coupled to first cascode transistors, where the sources of the first input transistors couple to degeneration inductors;
    in a high-linearity gain mode, biasing second cascode transistors of a second gain path using a low voltage, where the second gain path further comprises second input transistors coupled to the second cascode transistors, where the sources of the second input transistors couple to radio-frequency (RF) ground;

in a low-noise gain mode, biasing the second cascode transistors using a high voltage and amplifying the input signal using the second gain path;

in the low-noise gain mode, biasing the first input transistors using a low-noise voltage bias; and in the high-linearity gain mode, biasing the first input transistors using a high-linearity voltage bias.

8. The method of claim 7, further comprising:

in the low-noise gain mode, biasing the second input transistors using a low-noise voltage bias; and in the high-linearity gain mode, biasing the second input transistors using a high-linearity voltage bias.

9. The method of claim 7, further comprising:

in the low-noise gain mode, biasing the second input transistors using a second low-noise voltage bias distinct from the low-noise voltage bias; and in the high-linearity gain mode, biasing the second input transistors using a second high-linearity voltage bias distinct from the high-linearity voltage bias.

10. A method for amplifying a signal supporting a plurality of gain modes, comprising:

amplifying an input signal using a first gain path, the first gain path comprising first input transistors coupled to first cascode transistors, where the sources of the first input transistors couple to degeneration inductors;

in a high-linearity gain mode, biasing second cascode transistors of a second gain path using a low voltage, where the second gain path further comprises second input transistors coupled to the second cascode transistors, where the sources of the second input transistors couple to radio-frequency (RF) ground;

in a low-noise gain mode, biasing the second cascode transistors using a high voltage and amplifying the input signal using the second gain path;

in the low-noise gain mode, biasing the first cascode transistors using a low bias voltage; and in the high-linearity gain mode, biasing the first cascode transistors using a high bias voltage.

11. The method of claim 7, further comprising:

biasing the first cascode transistors using a high bias voltage in both the low-noise gain mode and the high-linearity gain mode.

12. A method for amplifying a signal supporting a plurality of gain modes, comprising:

amplifying an input signal using a first gain path, the first gain path comprising first input transistors coupled to first cascode transistors, where the sources of the first input transistors couple to degeneration inductors;

in a high-linearity gain mode, biasing second cascode transistors of a second gain path using a low voltage, where the second gain path further comprises second input transistors coupled to the second cascode transistors, where the sources of the second input transistors couple to radio-frequency (RF) ground;

in a low-noise gain mode, biasing the second cascode transistors using a high voltage and amplifying the input signal using the second gain path; and in an intermediate gain mode, biasing third cascode transistors of a third gain path using a high bias voltage, where the third gain path further comprises third input transistors coupled to the third cascode transistors, the sources of the third input transistors coupled to second degeneration inductors having lower inductance than the degeneration inductors coupled to the first input transistors, and the outputs of the third cascode transistors couple to the outputs of the first and second cascode transistors.

13. The apparatus of claim 4, wherein the gates of the first input transistors are coupled to a low-noise voltage bias in the low-noise gain mode, and to a high-linearity voltage bias in the high-linearity gain mode.

14. The apparatus of claim 13, wherein the gates of the second input transistors are coupled to the low-noise voltage bias in the low-noise gain mode, and to the high-linearity voltage bias in the high-linearity gain mode.

15. The apparatus of claim 13, wherein the gates of the second input transistors are coupled to a second low-noise voltage bias in the low-noise gain mode, the second low-noise voltage bias being distinct from the low-noise voltage bias, and to a second high-linearity voltage bias in the high-linearity gain mode, the second high-linearity voltage bias being distinct from the high-linearity voltage bias.

* * * * *